(12) United States Patent
Chung et al.

(10) Patent No.: US 11,451,753 B2
(45) Date of Patent: Sep. 20, 2022

(54) LIGHT SOURCE MODULE AND PROJECTOR

(71) Applicant: Coretronic Corporation, Hsin-Chu (TW)

(72) Inventors: Wen-Yen Chung, Hsin-Chu (TW); Mei-Chun Shih, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 71 days.

(21) Appl. No.: 16/795,597

(22) Filed: Feb. 20, 2020

(65) Prior Publication Data
US 2020/0275066 A1    Aug. 27, 2020

(30) Foreign Application Priority Data
Feb. 27, 2019 (CN) .......................... 201910145045.0

(51) Int. Cl.
*H04N 9/31* (2006.01)
*H05K 7/20* (2006.01)

(52) U.S. Cl.
CPC ......... *H04N 9/3144* (2013.01); *H04N 9/3164* (2013.01); *H05K 7/20409* (2013.01)

(58) Field of Classification Search
CPC .............. G03B 21/00–64; G03B 21/14; H04N 9/31–3197; H04N 9/3144
See application file for complete search history.

(56) References Cited

U.S. PATENT DOCUMENTS

| 2008/0259285 A1* | 10/2008 | Sawai ................ G03B 21/2033 353/31 |
| 2013/0100639 A1* | 4/2013 | Li ...................... G03B 21/2013 362/84 |

(Continued)

FOREIGN PATENT DOCUMENTS

| CN | 101963743 | 2/2011 |
| CN | 101978319 | 2/2011 |

(Continued)

OTHER PUBLICATIONS

"Office Action of China Counterpart Application", dated Jul. 13, 2021, p. 1-p. 14.

(Continued)

*Primary Examiner* — Christopher A Lamb, II
(74) *Attorney, Agent, or Firm* — JCIPRNET

(57) ABSTRACT

A light source module configured to provide an illumination light beam is provided. The light source module includes first, second, third and fourth light source components and a heat sink structure. The first light source component emits red light. The second light source component emits first green light. The third light source component emits first blue light. The fourth light source component emits second blue light towards the second light source component. The second light source component converts the second blue light into second green light. The illumination light beam includes the red light, the first green light, the first blue light, and the second green light. The heat sink structure is connected to the first light source component and is connected to one of the second light source component and the fourth light source component. In addition, a projector having the light source module is also provided.

34 Claims, 6 Drawing Sheets

(56) References Cited

U.S. PATENT DOCUMENTS

2014/0300872 A1 10/2014 Kim et al.
2017/0019645 A1* 1/2017 Li ........................ G03B 33/08
2018/0059521 A1* 3/2018 Nishimori ............ G03B 21/204

FOREIGN PATENT DOCUMENTS

| CN | 202394030 | 8/2012 |
|---|---|---|
| CN | 202975577 | 6/2013 |
| CN | 203395886 | 1/2014 |
| CN | 104865783 | 8/2015 |
| CN | 208506475 | 2/2019 |
| EP | 1903278 | 3/2008 |
| TW | I393988 | 4/2013 |

OTHER PUBLICATIONS

"Office Action of China Counterpart Application", dated Jan. 25, 2022, p. 1-p. 10.

* cited by examiner

LIGHT SOURCE MODULE AND PROJECTOR

CROSS-REFERENCE TO RELATED APPLICATION

This application claims the priority benefit of China application serial no. 201910145045.0, filed on Feb. 27, 2019. The entirety of the above-mentioned patent application is hereby incorporated by reference herein and made a part of this specification.

BACKGROUND

Technical Field

The invention relates to an optical module and a display device having the optical module. More particularly, the invention relates to a light source module and a projector having the light source module.

Description of Related Art

Projectors are display devices configured to generate large size frames. According to the imaging principle of projectors, an illumination light beam generated by a light source is converted into an image light beam by a light valve, and the image light beam is then projected onto a screen or a wall through a projection lens.

The light source modules of projectors generally include a red light source component, a green light source component, and a blue light source component configured to respectively provide the red light, the green light, and the blue light, so that white light acting as the illumination light beam is generated. In some projectors, auxiliary blue light source components are additionally disposed to provide auxiliary blue light to the green light source components to excite more green light, so that brightness of the illumination light beam is enhanced. Suitable temperatures at which these light source components operate are different, plural independent heat sink structures are thereby used most of the time to dissipate heat for these light source modules. Nevertheless, in this way, members of the light source modules become excessive, and that assembly time and device volume are significantly increased.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention were acknowledged by a person of ordinary skill in the art.

SUMMARY

The invention provides a light source module and a projector requiring less assembly time and less device volume.

Other objects and advantages of the invention can be further illustrated by the technical features broadly embodied and described as follows.

In order to achieve one or part of or all of the features, an embodiment of the invention provides a light source module configured to provide an illumination light beam. The light source module includes a first light source component, a second light source component, a third light source component, a fourth light source component, and a heat sink structure. The first light source component is configured to emit red light. The second light source component is configured to emit first green light. The third light source component is configured to emit first blue light. The fourth light source component is configured to emit second blue light towards the second light source component. The second light source component is configured to convert the second blue light into second green light. The illumination light beam includes the red light, the first green light, the first blue light, and the second green light. The heat sink structure is connected to the first light source component and is connected to one of the second light source component and the fourth light source component.

In order to achieve one or part of or all of the features, an embodiment of the invention provides a light source module configured to provide an illumination light beam. The light source module includes a first light source component, a second light source component, a third light source component, and a heat sink structure. The first light source component is configured to emit red light. The second light source component is configured to emit green light. The third light source component is configured to emit blue light. The illumination light beam includes the red light, the green light, and the blue light. The first light source component is configured to be turned on with a first duty cycle. The second light source component is configured to be turned on with a second duty cycle. A difference between the first duty cycle and the second duty cycle is less than 20%. The heat sink structure is connected to the first light source component and the second light source component.

In order to achieve one or a portion of or all of the objects or other objects, an embodiment of the invention provides a projector including a light source module, a light valve, and a projection lens. The light source module is configured to provide an illumination light beam. The light source module includes a first light source component, a second light source component, a third light source component, a fourth light source component, and a heat sink structure. The first light source component is configured to emit red light. The second light source component is configured to emit first green light. The third light source component is configured to emit first blue light. The fourth light source component is configured to emit second blue light towards the second light source component. The second light source component is configured to convert the second blue light into second green light. The illumination light beam includes the red light, the first green light, the first blue light, and the second green light. The heat sink structure is connected to the first light source component and is connected to one of the second light source component and the fourth light source component. The light valve is configured to convert the illumination light beam into an image light beam. The projection lens is configured to project the image light beam to an outside the projector.

In order to achieve one or a portion of or all of the objects or other objects, an embodiment of the invention provides a projector including a light source module, a light valve, and a projection lens. The light source module includes a first light source component, a second light source component, a third light source component, and a heat sink structure. The first light source component is configured to emit red light. The second light source component is configured to emit green light. The third light source component is configured to emit blue light. The illumination light beam includes the red light, the green light, and the blue light. The first light source component is configured to be turned on with a first duty cycle. The second light source component is configured to be turned on with a second duty cycle. A difference between the first duty cycle and the second duty cycle is less than 20%. The heat sink structure is connected to the first light source component and the second light source component. The light valve is configured to convert the illumination light beam into an image light beam. The projection lens is configured to project the image light beam to an outside the projector.

Base on the above, the embodiments of the invention have at least one of the following advantages or effects. The heat sink structure is not only connected to the first light source component configured to emit the red light but also connected to the second light source component configured to emit the first green light or the green light or the fourth light source component configured to emit the second blue light. That is, the first light source component and the rest of the light source components share the heat sink structure together, and in this way, the number of members of the heat sink structure is lowered, and that assembly time and device volume are therefore reduced.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
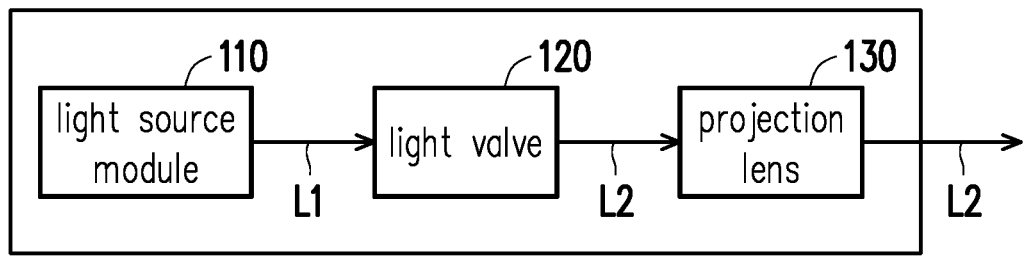
FIG. 1 is a schematic view of a projector according to an embodiment of the invention.

FIG. 1 is a schematic view of a projector according to an embodiment of the invention. With reference to FIG. 1, a projector 100 of this embodiment includes a light source module 110, a light valve 120, and a projection lens 130. The light source module 110 is configured to provide an illumination light beam L1. The light valve 120 is configured to convert the illumination light beam L1 into an image light beam L2. The projection lens 130 is configured to project the image light beam L2 to an outside the projector 100.

Figure 2:
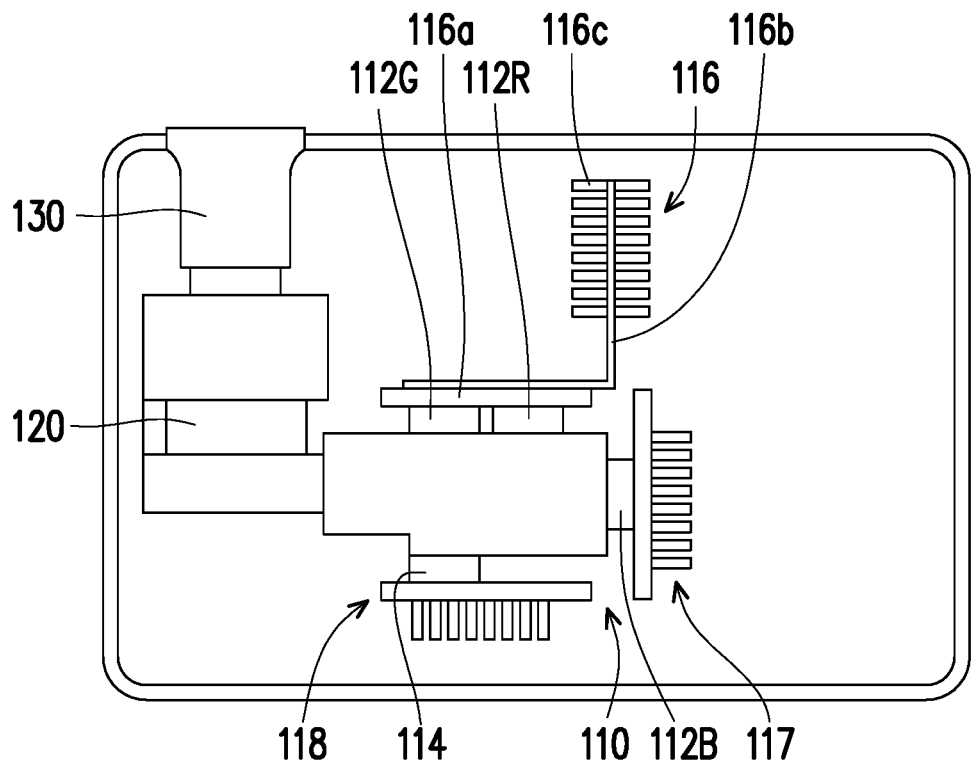
FIG. 2 is a schematic view of part of members of the projector of FIG. 1.

FIG. 2 is a schematic view of part of members of the projector of FIG. 1. With reference to FIG. 2, the light source module 110 of this embodiment includes a first light source component 112R, a second light source component 112G, a third light source component 112B, a fourth light source component 114, and a heat sink structure 116. The first light source component 112R is, for example, a red light source component and is configured to emit red light with a peak wavelength range of, for example, 610 nm to 640 nm. The second light source component 112G is, for example, a green light source component and is configured to emit first green light with a peak wavelength range of, for example, 500 nm to 570 nm. The third light source component 112B is, for example, a blue light source component and is configured to emit first blue light. The fourth light source component 114 is, for example, an auxiliary light source component and is configured to emit second blue light towards the second light source component 112G. The second light source component 112G is configured to convert the second blue light into second green light, so that brightness of the illumination light beam L1 is enhanced owing to increased green light. The illumination light beam L1 includes the red light, the first green light, the first blue light, and the second green light.

Specifically, the second light source component 112G of this embodiment may include a blue light emitting element (e.g., a blue light emitting diode element) and a wavelength conversion layer (e.g., a phosphor powder layer). The wavelength conversion layer is configured to convert third blue light emitted by the blue light emitting element into the first green light, and the second blue light emitted by the fourth light source component 114 towards the second light source component 112G is converted into the second green light by the wavelength conversion layer.

Relative position relations among the first light source component 112R, the second light source component 112G, the third light source component 112B, and the fourth light source component 114 shown in FIG. 2 are exemplary only. Other appropriate relative positions may also be applied, and the required light transmission may also be achieved through a suitable reflective element, a refractive element, and other light conduction elements, which is not limited by the invention.

In this embodiment, a difference between a peak wavelength range of the first green light emitted by the second light source component 112G and a peak wavelength range of the second blue light emitted by the fourth light source component 114 is, for example, 80 nm to 120 mm, but the invention is not limited thereto. In addition, a wavelength of the first blue light emitted by the third light source component 112B may be different from a wavelength of the second blue light emitted by the fourth light source component 114, which is not limited by the invention. Further, since the third blue light emitted by the blue light emitting element of the second light source component 112G requires, for example, a shorter wavelength to excite the second green light in the wavelength conversion layer, the wavelength of the third blue light may be different from the wavelength of the first blue light emitted by the third light source component 112B. Nevertheless, the invention is not limited thereto.

As shown in FIG. 2, the heat sink structure 116 is not only connected to the first light source component 112R configured to emit the red light but also connected to the second light source component 112G configured to emit the first green light. That is, the first light source component 112R and the second light source component 112G share the heat sink structure 116 together, and in this way, a number of members of the heat sink structure may be reduced, thereby reducing assembly time and device volume.

Further, the light source module 110 of this embodiment may convert into, for example, a first light emitting mode and a second light emitting mode. The first light emitting mode may be a full brightness mode. In this mode, not only the first light source component 112R, the second light source component 112G, and the third light source component 112B are turned on, the fourth light source component 114 is also turned on, the second blue light emitted by the fourth light source component 114 illuminates the second light source component 112G to excite more green light enhancing brightness. Moreover, the second light emitting mode may be a theater mode. In this mode, the first light source component 112R, the second light source component 112G, and the third light source component 112B are turned on, the fourth light source component 114 is turned off or a duty cycle of the fourth light source component 114 is lowered, and intensity of the red light emitted by the first light source component 112R and intensity of the first blue light emitted by the third light source component 112B are enhanced, so as to satisfy the demand for pure colors.

Accordingly, since light emitting intensity of a light source component may be affected by the temperature, so in different light emitting modes, a target temperature of each of the light source components exhibiting different color light is different due to their different light emitting intensity. In the full brightness mode, a target temperature of the first light source component 112R is approximately, for example, 57 degrees Celsius, and a target temperature of the second light source component 112G is approximately, for example, 63 degrees Celsius. In the theater mode, the target temperature of the first light source component 112R is approximately, for example, 51 degrees Celsius, and the target temperature of the second light source component 112G is approximately, for example, 46 degrees Celsius. It thus can be seen that regardless of the full brightness mode or the theater mode, the difference between the target temperature of the first light source component 112R and the target temperature of the second light source component 112G is not significant. Therefore, when heat dissipation is performed to the first light source component 112R and the second light source component 112G through the same heat sink structure 116, the temperature of the first light source component 112R and the temperature of the second light source component 112G both fall within the target temperature range in each of the light emitting modes.

In this embodiment, the second light source component 112G and the fourth light source component 114 may be simultaneously controlled through the same signal or may be controlled through different signals, which is not limited by the invention. In addition, in this embodiment, the first light source component 112R connected to the heat sink structure 116 is turned on with a first duty cycle, and the second light source component 112G connected to the heat sink structure 116 is turned on with a second duty cycle. A difference between the first duty cycle and the second duty cycle is less than, for example, 20%, but the invention is not limited thereto. Moreover, a difference between a temperature at which the first light source component 112R is turned on and a temperature at which the second light source component 112G is turned on is less than 5 degrees Celsius, but the invention is not limited thereto.

In this embodiment, the light source module 110 may further include a heat sink structure 117 and a heat sink structure 118. The heat sink structure 117 is connected to the third light source component 112B and performs heat dissipation to the third light source component 112B. The heat sink structure 118 is connected to the fourth light source component 114 and performs heat dissipation to the fourth light source component 114.

Arrangement of the heat sink structure 116 of this embodiment is specifically described as follows. As shown in FIG. 2, the heat sink structure 116 of this embodiment includes a substrate 116a, a heat pipe 116b, and a heat sink fin set 116c. The first light source component 112R and the second light source component 112G are disposed on the substrate 116a. A light emitting direction of the first light source component 112R is identical to a light emitting direction of the second light source component 112G. The heat pipe 116b is connected to the substrate 116a, and the heat sink fin set 116c is disposed on the heat pipe 116b. In other embodiments, other forms may be adopted for the heat sink structure, and examples are provided through accompanying drawings as follows.

Figure 3:
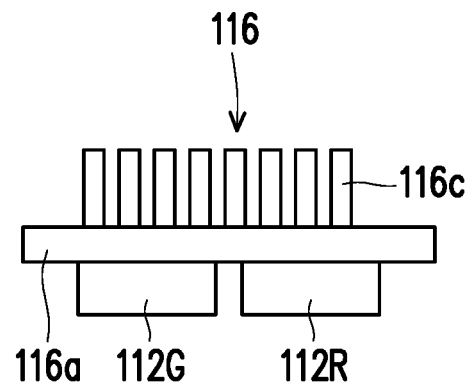
FIG. 3 is a schematic view of a first light source component, a second light source component, and a heat sink structure according to another embodiment of the invention.

FIG. 3 is a schematic view of a first light source component, a second light source component, and a heat sink structure according to another embodiment of the invention. A difference between the embodiment of FIG. 3 and the embodiment of FIG. 2 is that the heat sink fin set 116c is disposed on the substrate 116a and the heat sink structure 116 does not include the heat pipe 116b as shown in FIG. 2 in the embodiment of FIG. 3.

Figure 4:
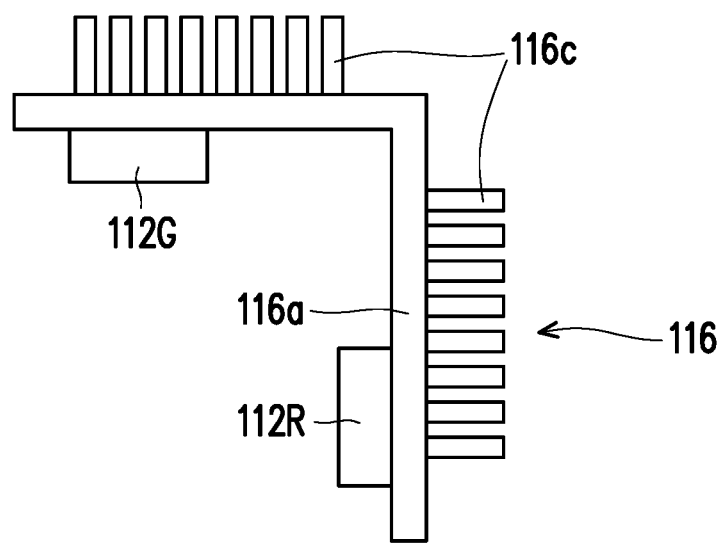
FIG. 4 is a schematic view of the first light source component, the second light source component, and the heat sink structure according to another embodiment of the invention.

FIG. 4 is a schematic view of the first light source component, the second light source component, and the heat sink structure according to another embodiment of the invention. A difference between the embodiment of FIG. 4 and the embodiment of FIG. 3 is that the substrate 116a is an L-shaped structure so that the light emitting directions of the first light source component 112R and the second light source component 112G are different in the embodiment of FIG. 4.

Figure 5:
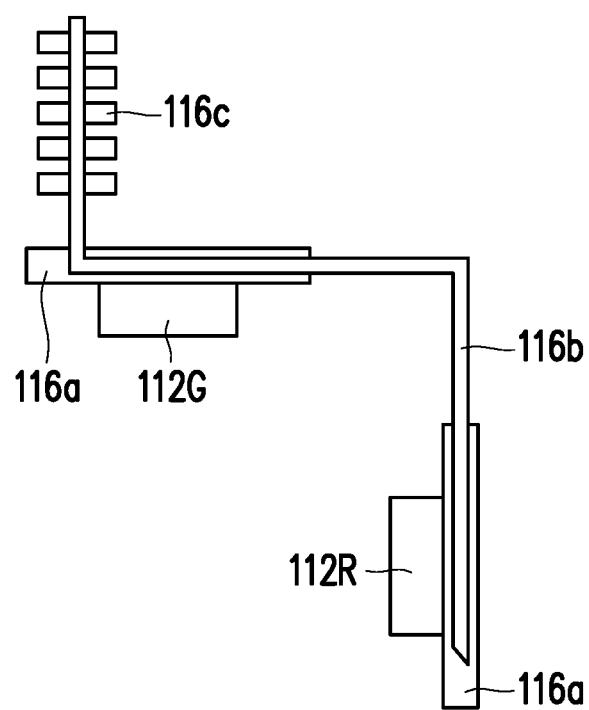
FIG. 5 is a schematic view of the first light source component, the second light source component, and the heat sink structure according to another embodiment of the invention.

FIG. 5 is a schematic view of the first light source component, the second light source component, and the heat sink structure according to another embodiment of the invention. A difference between the embodiment of FIG. 5 and the embodiment of FIG. 2 is that a number of the substrate 116a is two, the heat pipe 116b is connected to the two substrates 116a, and the first light source component 112R and the second light source component 112G are separately disposed on the two substrates 116a in the embodiment of FIG. 5. That is, the first light source component 112R is disposed on one of the two substrates 116a, and the second light source component 112G is disposed on the other one of the two substrates 116a. Further, the light emitting directions of the first light source component 112R and the second light source component 112G are different.

Figure 6:
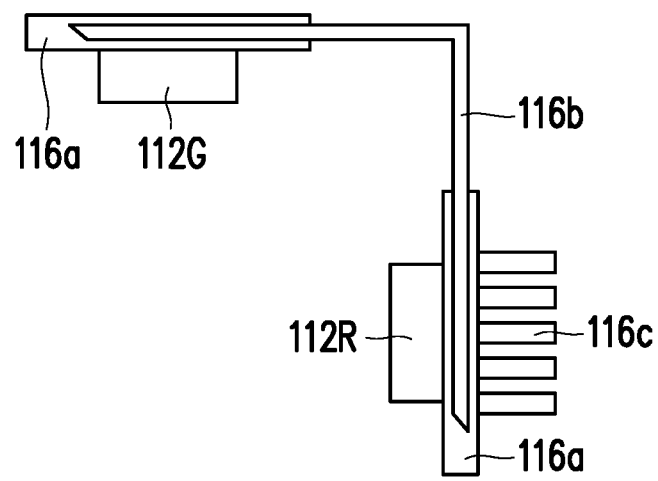
FIG. 6 is a schematic view of the first light source component, the second light source component, and the heat sink structure according to another embodiment of the invention.

FIG. 6 is a schematic view of the first light source component, the second light source component, and the heat sink structure according to another embodiment of the invention. A difference between the embodiment of FIG. 6 and the embodiment of FIG. 5 is that the heat sink fin set 116c is connected to the substrate 116a on which the first light source component 112R is disposed instead of being connected to the heat pipe 116b in the embodiment of FIG. 6.

Figure 7:
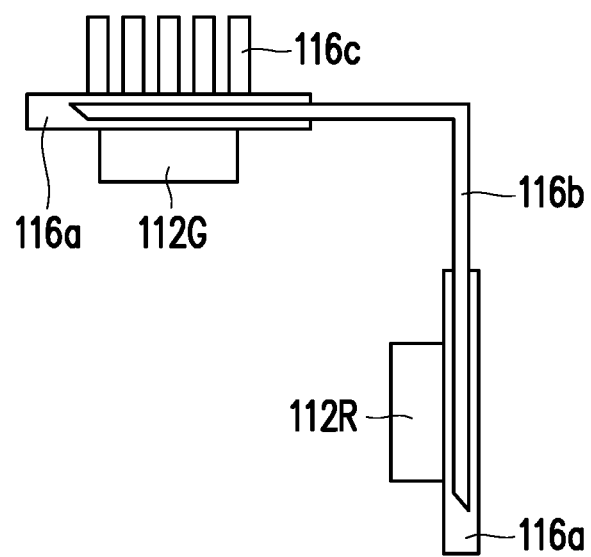
FIG. 7 is a schematic view of the first light source component, the second light source component, and the heat sink structure according to another embodiment of the invention.

FIG. 7 is a schematic view of the first light source component, the second light source component, and the heat sink structure according to another embodiment of the invention. A difference between the embodiment of FIG. 7 and the embodiment of FIG. 6 is that the heat sink fin set 116c is connected to the substrate 116a on which the second light source component 112G is disposed instead of being connected to the substrate 116a on which the first light source component 112R is disposed in the embodiment of FIG. 7.

Figure 8:
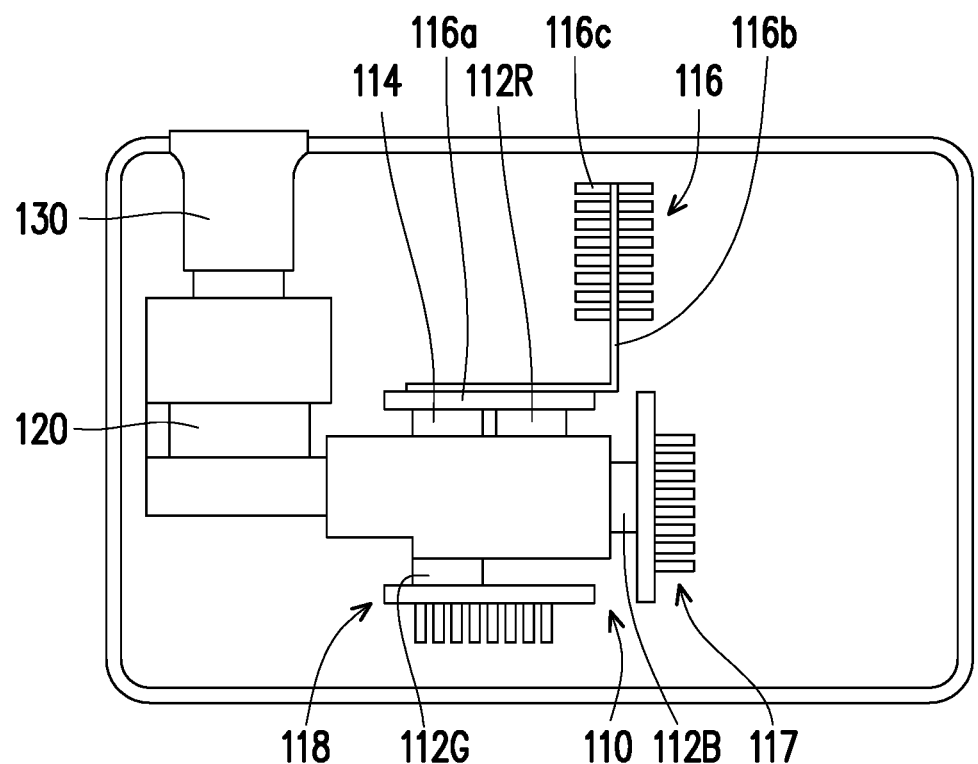
FIG. 8 is a schematic view of part of members of a projector according to another embodiment of the invention.

How the first light source component 112R and the rest of light source components share the heat sink structure 116 is not limited by the invention, and examples are provided through accompanying drawings as follows. FIG. 8 is a schematic view of part of members of a projector 101 according to another embodiment of the invention. A difference between the embodiment of FIG. 8 and the embodiments of FIG. 1 and FIG. 2 is that the heat sink structure 116 of FIG. 8 is connected to the fourth light source component 114 instead of being connected to the second light source component 112G. That is, in FIG. 8, the first light source component 112R shares the heat sink structure 116 together with the fourth light source component 114 rather than sharing the heat sink structure 116 with the second light source component 112G. With such arrangement, the second light source component 112G and the fourth light source component 114 may be designed to be controlled through different signals. In this way, in the theater mode, the second light source component 112G may be turned on and the unnecessary fourth light source component 114 in this mode may be forced to be turned off through different signals to avoid that the operating temperature of the fourth light source component 114 causes the operating temperature of the first light source component 112R to excessively deviate from its target temperature in the theater mode.

In addition, in the embodiment of FIG. 8, the first light source component 112R connected to the heat sink structure 116 is turned on with the first duty cycle, and the fourth light source component 114 connected to the heat sink structure 116 is turned on with the second duty cycle. The difference between the first duty cycle and the second duty cycle is less than, for example, 20%, but the invention is not limited thereto.

In the embodiment of FIG. 8, the heat sink structure 116 of any form shown in FIG. 3 to FIG. 7 may be adopted, which is not limited by the invention.

Figure 9:
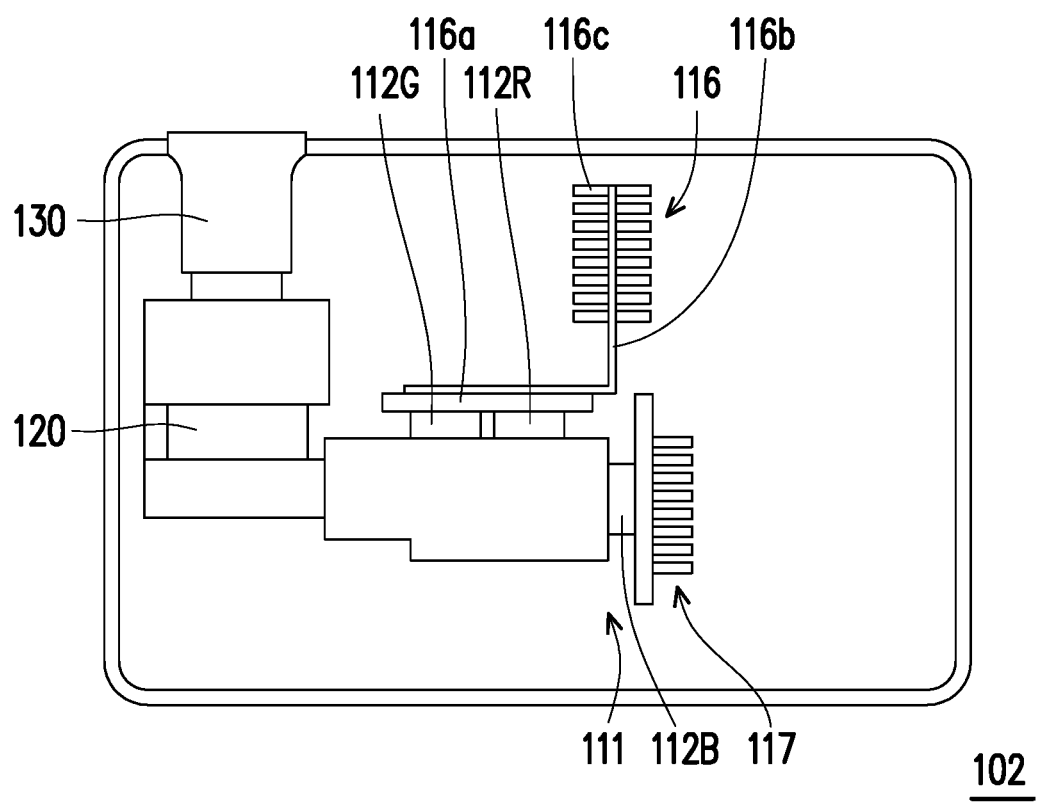
FIG. 9 is a schematic view of part of members of a projector according to another embodiment of the invention.

The invention may not only be applied to the structure having four light source components but also to a structure having three light source components, and examples are provided through accompanying drawings as follows. FIG. 9 is a schematic view of part of members of a projector 102 according to another embodiment of the invention. A difference between the embodiment of FIG. 9 and the embodiments of FIG. 1 and FIG. 2 is that the fourth light source component 114 and the heat sink structure 118 are not included in a structure of FIG. 9. Specifically, in the embodiment of FIG. 9, the light source module 111 includes the first light source component 112R, the second light source component 112G, the third light source component 112B, and the heat sink structure 116 as shown in the embodiment of FIG. 2. The first light source component 112R is, for example, a red light source component and is configured to emit red light. The second light source component 112G is, for example, a green light source component and is configured to emit green light. The third light source component 112B is, for example, a blue light source component and is configured to emit blue light. The illumination light beam L1 includes the red light, the green light, and the blue light. The heat sink structure 116 of FIG. 9 is connected to the first light source component 112R and the second light source component 112G. That is, in FIG. 9, the first light source component 112R and the second light source component 112G share the heat sink structure 116 together, and in this way, the number of members of the heat sink structure may be reduced, thereby reducing assembly time and device volume. Moreover, in this embodiment, the first light source component 112R is turned on with the first duty cycle, and the second light source component 112G is turned on with the second duty cycle. The difference between the first duty cycle and the second duty cycle is, for example, less than 20%.

Specifically, in the embodiment of FIG. 9, similar to the embodiment of FIG. 2, the second light source component 112G may include a blue light emitting element (e.g., a blue light emitting diode element) and a wavelength conversion layer (e.g., a phosphor powder layer). The wavelength conversion layer is configured to convert the blue light emitted by the blue light emitting element into the green light. In addition, the second light source component 112G of the embodiment of FIG. 9 may be a green light emitting diode element capable of emitting the green light directly.

In the embodiment of FIG. 9, the heat sink structure 116 of any form shown in FIG. 3 to FIG. 7 may be adopted, which is not limited by the invention. Moreover, in the embodiment of FIG. 9, the difference between the temperature at which the first light source component 112R is turned on and the temperature at which the second light source component 112G is turned on is less than 5 degrees Celsius, but the invention is not limited thereto.

In summary, the embodiments of the invention have at least one of the following advantages or effects. The heat sink structure is not only connected to the first light source component configured to emit the red light but also connected to the second light source component configured to emit the first green light or the green light or the fourth light source component configured to emit the second blue light. That is, the first light source component and the rest of the light source components share the heat sink structure together, and in this way, the number of members of the heat sink structure may be reduced, thereby reducing assembly time and device volume.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light source module, configured to provide an illumination light beam, wherein the light source module comprises a first light source component, a second light source component, a third light source component, a fourth light source component, and a heat sink structure, wherein:
the first light source component is configured to emit red light,
the second light source component is configured to emit first green light, and the second light source component comprises a blue light emitting element and a wavelength conversion layer;
the third light source component is configured to emit first blue light,
the fourth light source component is configured to emit second blue light towards the second light source component, wherein the second light source component is configured to convert the second blue light into second green light, wherein the illumination light beam comprises the red light, the first green light, the first blue light, and the second green light, and
the heat sink structure comprises a first part and a second part connected to the first part, the first part is connected to the first light source component, and the second part is connected to one of the second light source component and the fourth light source component.

2. The light source module as claimed in claim 1, wherein the heat sink structure is connected to the first light source component and is connected to the second light source component, and the second light source component and the fourth light source component are controlled through the same signal or are controlled through different signals.

3. The light source module as claimed in claim 1, wherein the heat sink structure is connected to the first light source component and is connected to the fourth light source component, and the second light source component and the fourth light source component are controlled by different signals.

4. The light source module as claimed in claim 1, wherein the heat sink structure comprises at least one substrate, the first light source component is disposed on the at least one substrate, and one of the second light source component and the fourth light source component is disposed on the at least one substrate.

5. The light source module as claimed in claim 4, wherein a number of the at least one substrate is two, the heat sink structure comprises a heat pipe, the heat pipe is connected to the two substrates, the first light source component is disposed on one of the two substrates, and one of the second light source component and the fourth light source component is disposed on the other one of the two substrates.

6. The light source module as claimed in claim 4, wherein the heat sink structure comprises at least one heat sink fin set, and the at least one heat sink fin set is disposed on the at least one substrate.

7. The light source module as claimed in claim 4, wherein the heat sink structure comprises at least one heat sink fin set and a heat pipe, the heat pipe is connected to the at least one substrate, and the at least one heat sink fin set is disposed on the heat pipe.

8. The light source module as claimed in claim 1, wherein a light emitting direction of the first light source component is identical to or different from a light emitting direction of the second light source component.

9. The light source module as claimed in claim 1, wherein the first light source component is configured to be turned on with a first duty cycle, the one of the second light source component and the fourth light source component connected to the heat sink structure is turned on with a second duty cycle, and a difference between the first duty cycle and the second duty cycle is less than 20%.

10. The light source module as claimed in claim 1, wherein a difference between a temperature at which the first light source component is turned on and a temperature at which the second light source component is turned on is less than 5 degrees Celsius.

11. A light source module, configured to provide an illumination light beam, wherein the light source module comprises a first light source component, a second light source component, a third light source component, a first heat sink structure, and a second heat sink structure, wherein:
the first light source component is configured to emit red light,
the second light source component is configured to emit green light,
the third light source component is configured to emit blue light,
wherein the illumination light beam comprises the red light, the green light, and the blue light, the first light source component is configured to be turned on with a first duty cycle, the second light source component is configured to be turned on with a second duty cycle, and a difference between the first duty cycle and the second duty cycle is less than 20%, and
the first heat sink structure comprises a first part and a second part connected to the first part, the first part is connected to the first light source component, the second part is connected to the second light source component, the third light source component is connected to the second heat sink structure, and the second heat sink structure is not connected to the first heat sink structure.

12. The light source module as claimed in claim 11, wherein the first heat sink structure comprises at least one substrate, the first light source component is disposed on the at least one substrate, and the second light source component is disposed on the at least one substrate.

13. The light source module as claimed in claim 12, wherein a number of the at least one substrate is two, the first heat sink structure comprises a heat pipe, the heat pipe is connected to the two substrates, the first light source component is disposed on one of the two substrates, and the second light source component is disposed on the other one of the two substrates.

14. The light source module as claimed in claim 12, wherein the first heat sink structure comprises at least one heat sink fin set, and the at least one heat sink fin set is disposed on the at least one substrate.

15. The light source module as claimed in claim 12, wherein the first heat sink structure comprises at least one heat sink fin set and a heat pipe, the heat pipe is connected to the at least one substrate, and the at least one heat sink fin set is disposed on the heat pipe.

16. The light source module as claimed in claim 11, wherein a light emitting direction of the first light source component is identical to or different from a light emitting direction of the second light source component.

17. The light source module as claimed in claim 11, wherein a difference between a temperature at which the first light source component is turned on and a temperature at which the second light source component is turned on is less than 5 degrees Celsius.

18. A projector, comprising a light source module, a light valve, and a projection lens, wherein:
the light source module is configured to provide an illumination light beam, and the light source module comprises a first light source component, a second light source component, a third light source component, a fourth light source component, and a heat sink structure, wherein:
the first light source component is configured to emit red light,
the second light source component is configured to emit first green light, and the second light source component comprises a blue light emitting element and a wavelength conversion layer;
the third light source component is configured to emit first blue light,
the fourth light source component is configured to emit second blue light towards the second light source component, wherein the second light source component is configured to convert the second blue light into second green light, wherein the illumination light beam comprises the red light, the first green light, the first blue light, and the second green light, and
the heat sink structure comprises a first part and a second part connected to the first part, the first part is connected to the first light source component, and the second part is connected to one of the second light source component and the fourth light source component,
the light valve is configured to convert the illumination light beam into an image light beam, and
the projection lens is configured to project the image light beam to an outside of the projector.

19. The projector as claimed in claim 18, wherein the heat sink structure is connected to the first light source component and is connected to the second light source component, and the second light source component and the fourth light source component are controlled by the same signal or are controlled by different signals.

20. The projector as claimed in claim 18, wherein the heat sink structure is connected to the first light source component and is connected to the fourth light source component, and the second light source component and the fourth light source component are controlled by different signals.

21. The projector as claimed in claim 18, wherein the heat sink structure comprises at least one substrate, the first light source component is disposed on the at least one substrate, and one of the second light source component and the fourth light source component is disposed on the at least one substrate.

22. The projector as claimed in claim 21, wherein a number of the at least one substrate is two, the heat sink structure comprises a heat pipe, the heat pipe is connected to the two substrates, the first light source component is disposed on one of the two substrates, and one of the second light source component and the fourth light source component is disposed on the other one of the two substrates.

23. The projector as claimed in claim 21, wherein the heat sink structure comprises at least one heat sink fin set, and the at least one heat sink fin set is disposed on the at least one substrate.

24. The projector as claimed in claim 21, wherein the heat sink structure comprises at least one heat sink fin set and a heat pipe, the heat pipe is connected to the at least one substrate, and the at least one heat sink fin set is disposed on the heat pipe.

25. The projector as claimed in claim 18, wherein a light emitting direction of the first light source component is identical to or different from a light emitting direction of the second light source component.

26. The projector as claimed in claim 18, wherein the first light source component is configured to be turned on with a first duty cycle, the one of the second light source component and the fourth light source component connected to the heat sink structure is turned on with a second duty cycle, and a difference between the first duty cycle and the second duty cycle is less than 20%.

27. The projector as claimed in claim 18, wherein a difference between a temperature at which the first light source component is turned on and a temperature at which the second light source component is turned on is less than 5 degrees Celsius.

28. A projector, comprising a light source module, a light valve, and a projection lens, wherein:
the light source module is configured to provide an illumination light beam, and the light source module comprises a first light source component, a second light source component, a third light source component, a first heat sink structure, and a second heat sink structure, wherein:
the first light source component is configured to emit red light,
the second light source component is configured to emit green light,
the third light source component is configured to emit blue light,
wherein the illumination light beam comprises the red light, the green light, and the blue light, the first light source component is configured to be turned on with a first duty cycle, the second light source component is configured to be turned on with a second duty cycle, and a difference between the first duty cycle and the second duty cycle is less than 20%, and
the first heat sink structure comprises a first part and a second part connected to the first part, the first part is connected to the first light source component, the second part is connected to the second light source component, the third light source component is connected to the second heat sink structure, and the second heat sink structure is not connected to the first heat sink structure,
the light valve is configured to convert the illumination light beam into an image light beam, and
the projection lens is configured to project the image light beam to an outside of the projector.

29. The projector as claimed in claim 28, wherein the first heat sink structure comprises at least one substrate, the first light source component is disposed on the at least one substrate, and the second light source component is disposed on the at least one substrate.

30. The projector as claimed in claim 29, wherein a number of the at least one substrate is two, the first heat sink structure comprises a heat pipe, the heat pipe is connected to the two substrates, the first light source component is disposed on one of the two substrates, and the second light source component is disposed on the other one of the two substrates.

31. The projector as claimed in claim 29, wherein the first heat sink structure comprises at least one heat sink fin set, and the at least one heat sink fin set is disposed on the at least one substrate.

32. The projector as claimed in claim 29, wherein the first heat sink structure comprises at least one heat sink fin set and a heat pipe, the heat pipe is connected to the at least one substrate, and the at least one heat sink fin set is disposed on the heat pipe.

33. The projector as claimed in claim 28, wherein a light emitting direction of the first light source component is identical to or different from a light emitting direction of the second light source component.

34. The projector as claimed in claim 28, wherein a difference between a temperature at which the first light source component is turned on and a temperature at which the second light source component is turned on is less than 5 degrees Celsius.

* * * * *